United States Patent
Sato

[19]

[11] Patent Number: 6,120,605
[45] Date of Patent: Sep. 19, 2000

[54] SEMICONDUCTOR PROCESSING SYSTEM

[75] Inventor: Kiyoshi Sato, Tokyo, Japan

[73] Assignee: ASM Japan K.K., Tokyo, Japan

[21] Appl. No.: 09/019,394

[22] Filed: Feb. 5, 1998

[51] Int. Cl.[7] .................................................. C23C 16/00
[52] U.S. Cl. .......................... 118/715; 118/725; 156/345
[58] Field of Search ............................... 118/715, 725, 118/723 R, 723 E, 723 ER, 719, 728, 729, 733; 156/345

[56] References Cited

U.S. PATENT DOCUMENTS

| | | | |
|---|---|---|---|
| 4,693,211 | 9/1987 | Ogami et al. ............................. | 118/725 |
| 4,870,923 | 10/1989 | Sugimoto ................................. | 118/715 |
| 5,000,113 | 3/1991 | Wang et al. .............................. | 118/715 |
| 5,186,756 | 2/1993 | Benko et al. ............................ | 118/730 |
| 5,192,370 | 3/1993 | Oda et al. ................................ | 118/723 |
| 5,441,568 | 8/1995 | Cho et al. ................................ | 118/728 |
| 5,472,508 | 12/1995 | Saxena ................................ | 118/723 E |
| 5,525,160 | 6/1996 | Tanaka et al. .......................... | 118/728 |
| 5,558,717 | 9/1996 | Zhao ..................................... | 118/715 |
| 5,772,770 | 6/1998 | Suda et al. .............................. | 118/719 |
| 5,891,350 | 4/1999 | Shan et al. .......................... | 118/723 E |
| 5,935,833 | 8/1999 | Lei et al. ................................ | 118/725 |

FOREIGN PATENT DOCUMENTS 63-141318   6/1988   Japan .

*Primary Examiner*—Jeffrie R Lund
*Attorney, Agent, or Firm*—Knobbe, Martens, Olson & Bear, LLP

[57] ABSTRACT

A single wafer processing type of a semiconductor processing system is provided so as to achieve that residual particles inside a reactor thereof are efficiently removed and a gas injected into the reactor is uniformly flowed over a wafer in a wide range of the gas flow rate. The semiconductor processing system includes gas flow adjusting means (28, 29, 30) having a slit (30) communicated with an exhaust port (35) for pumping out a gas injected into a reactor (10) from the reactor (10). The slit (30) is provided annularly around a circumference of a wafer (34) and positioned below a position of the wafer (34), and a width of the slit (30) is narrowed about the exhaust port (35).

8 Claims, 8 Drawing Sheets

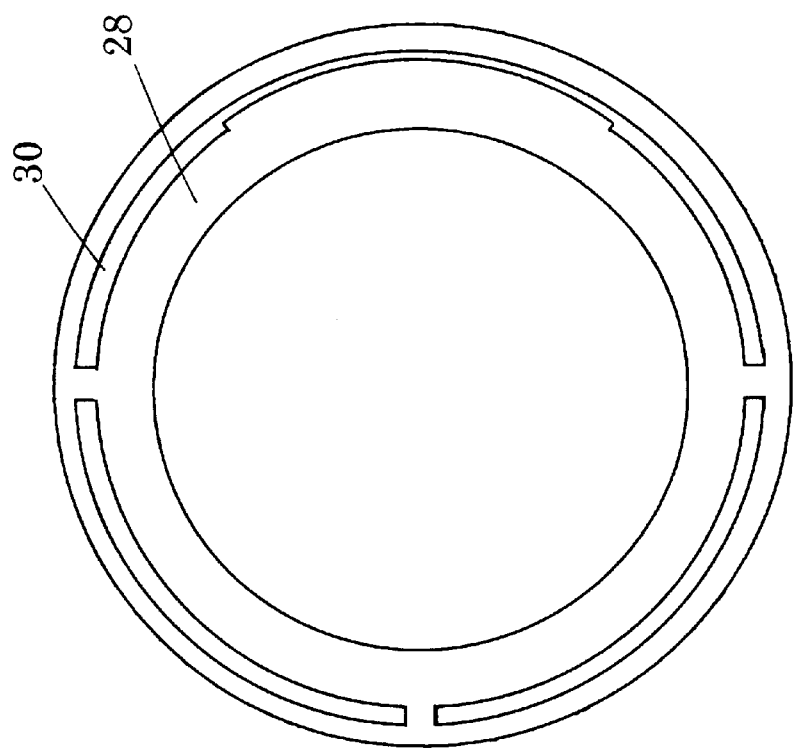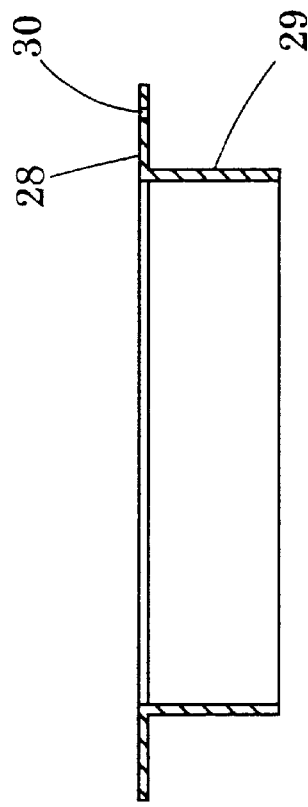
FIG. 3A
FIG. 3B

SEMICONDUCTOR PROCESSING SYSTEM

TECHNICAL FIELD

The present invention relates to a single wafer processing type of a semiconductor processing system for depositing or growing a semiconductor film, an insulating film, a metallic film or the like on a wafer and, in particular, relates to a single wafer processing type of a semiconductor processing system in which a process gas flows uniformly over a wafer.

BACKGROUND OF THE ART

Recently, a size of a wafer has become larger in diameter and, simultaneously, a single wafer processing type has become a main stream of a semiconductor processing system in the place of a batch processing type.

A single wafer processing type of a semiconductor processing system in an earlier technology comprises gas injecting means for injecting a process gas to be contributed to a reaction into a reactor, susceptor means for supporting a wafer in the reactor, energy supplying means for exciting and reacting the process gas injected in the reactor, and gas pumping means for pumping out the process gas from the reactor. In this system, the process gas is injected downward onto the wafer supported in the reactor, and then, thermal or plasma energy is supplied to the process gas to excite and react the process gas, in order to repeatedly perform a film deposition process for depositing a film corresponding to a composition of the process gas on the wafer or an etching process.

In such a process, it is required to reduce the number of particles of a reaction product attached on the wafer in view of a large scale integration of semiconductor devise. For example, the number thereof is required to be less than 10 particles, each particle having more than 0.1 $\mu$m in diameter, on a wafer having 200 mm in diameter.

In general, a part of the process gas is not contributed to a film deposition and a part of the reaction product is not deposited on a wafer. In the semiconductor processing system described above, such a process gas and such a residual reaction product should be pumped out from a reaction region of the reactor by following to a pumped gas flow. However, the residual reaction product is deposited on a wall of the reactor during the residual reaction product is pumped out from the reactor, and as a result, when a film deposition is repeatedly performed, the residual reaction product deposited on the wall of the reactor is separated and floated and is then attached on the wafer.

As an example, in a chemical vapor deposition (CVD) system which serves to form a silicon oxide film on a wafer by flowing a gas mixture as a process gas of tetraethoxysilane ($Si(OC_2H_5)_4$) (TEOS) and ozone gas over a surface of the wafer, a large quantity of a silicon oxide film as a residual reaction product is deposited inside a reactor thereof.

Also, as another example, in a film deposition processing system which serves to form a tungsten film by tungsten reduction reaction by injecting $WF_6$ gas, $SiH_4$ gas and $H_2$ gas, such a metallic film is deposited on a wall of a reactor thereof other than a surface of a wafer and is then separated from the wall, and particles thereof is floated in the reactor and is then attached on the wafer so as to contaminate the wafer.

Thus, in order to remove a reaction product deposited inside a reactor, a wafer is unloaded from the reactor after the wafer is completely processed and then, a periodical cleaning of the reactor is manually done, or a chemical cleaning is done by introducing a chemically reactive gas into the reactor to change a film of the reaction product deposited inside the reactor into a gas condition or by use of an excited fluoric plasma gas.

Meanwhile, the capacity of throughput in a processing system can be represented by the product of the working time of the system and the throughput per unit time.

In a single wafer processing type of the semiconductor processing system described above, a replacement of expendable supplies of the system and a cleaning inside the reactor must be done during the system is stopped, and thus, in order to improve the capacity of throughput of the system, it is required to improve the throughput during the working time of the system and to reduce the non working time thereof.

In general, the deposition rate is increased in order to improve the throughput in the working time. However, for example, when an insulating film is deposited by plasma excitation, the deposition rate is required to be more than 500 nm/min.

In order to achieve such a high deposition rate, it is important to flow a gas to be contributed to a reaction uniformly over a wafer.

A single wafer processing type of a semiconductor processing system disclosed in Japanese Patent Laying-Open No. Heisei 6 (1994)-13368 (corresponding to U.S. Ser. No. 944492 ) comprises a plasma self cleaning mechanism and gas flow adjusting means for flowing a process gas from a central part of a wafer to a circumference thereof.

The semiconductor processing system of Japanese Patent Laying-Open No. Heisei 6(1994)-13368 is a plasma excitation vapor deposition processing system, and the gas flow adjusting means thereof comprise a gas flow adjusting plate having exhaust holes arranged annularly thereon and are provided below a position of the wafer placed in the reactor so as to locate the annular arrangement of the exhaust holes of the gas flow adjusting plate around and bellow the wafer. The wafer is supported by a susceptor. A manifold is located above the wafer, and a gas is injected and directed to the wafer through many holes provided in the manifold. The gas directed to the wafer is excited as plasma excitation between plasma generating electrodes comprising of the manifold (as a RF electrode) and the susceptor (as a ground electrode), and the gas is changed into an active condition and is reacted on the wafer supported by the susceptor. After the wafer is processed, the gas is pumped out from the reactor through the exhaust holes arranged annularly on the gas flow adjusting plate provided around and below the wafer position and through an annular channel communicated with those exhaust holes.

After a film deposition is completed, a fluoric gas is introduced into the reactor and is then activated by plasma energy so as to generate an active species of the fluoric gas, and thereby a reaction product attached inside the reactor is removed (plasma cleaning In the system of Japanese Patent Laying-Open No. Heisei 6(1994)-13368, the exhaust holes are annularly arranged on the gas flow adjusting plate at spaces between them, and due to such an arrangement, even though the activated fluoric gas comes into the annular channel, the activated fluoric gas can not be carried well through the whole space inside the channel and as a result, a reaction product attached inside the channel can not be removed completely.

Thus, when a wafer is successively processed, a residual reaction product inside the channel is floated so as to contaminate the wafer.

A gas flow rate injected into a reactor depends on a nature of a film to be deposited and a condition of a film deposition.

In general, in a single wafer processing type of a semiconductor processing system, when the gas flow rate is small, a uniform gas flow over a wafer is achieved by additionally introducing a carrier gas (which is not contributed to a reaction) into the reactor.

In the system of Japanese Patent Laying-Open No. Heisei 6(1994)-13368, when a silicon dioxide film is deposited on a wafer by use of plasma energy, helium gas as an inert gas (a carrier gas) is additionally introduced into the reactor (900 sccm of helium gas against 600 sccm of oxygen gas). That is, 1500 sccm of gas is totally introduced into the reactor to achieve a uniform gas flow over the wafer.

However, when a carrier gas is additionally introduced, the concentration of a process gas and the deposition rate are reduced, and as a result, the capacity of processing a wafer in the system is reduced.

SUMMARY OF THE INVENTION

Therefore, an object of the present invention is to provide a single wafer processing type of a semiconductor processing system in which residual particles inside a reactor can be efficiently removed and a gas flow over a wafer can be uniform in a wide range of a gas flow rate.

In order to overcome this and another object, a single wafer processing type of a semiconductor processing system according to the present invention comprises a reactor having an inner wall and a bottom wall, susceptor means for supporting a wafer to be processed in the reactor, gas injecting means for injecting a process gas onto the wafer supported in the reactor, pumping means for pumping out the gas injected in the reactor through an exhaust port provided in the reactor, and gas flow adjusting means for uniformly flowing the injected gas radially from a central part of the wafer to a circumferential part of the wafer. The gas flow adjusting means are arranged around a circumference of the wafer and has a slit communicated with the exhaust port and having a shape along the circumference of the wafer.

The slit is positioned below the wafer so as to provide a difference in level around the circumference of the wafer, in order to flow the gas injected onto the wafer to the slit through the wafer. Moreover, the injected gas is pumped and directed toward the exhaust port, and due to this, a width of the slit is narrowed about the exhaust port so as to adjust a flow rate of the pumped gas, in order not to bias the pumped gas about the exhaust port.

Thus, even though the flow rate of the gas injected onto the wafer is little, the gas injected in the reactor can be uniformly flowed and directed radially from the central part of the wafer to the circumferential part thereof.

The gas flow adjusting means include an annular top plate, and the slit may be formed on this top plate or may be formed of a circumferential part of the top plate and the inner wall of the reactor. In alternative, the gas flow adjusting means further include a cylindrical side plate extended downward from an inner end of the annular top plate other than the annular top plate, and the slit may be formed on this side plate or may be formed of a lower part of a circumference of the side plate and the bottom wall of the reactor.

Other and further objects of the present invention will be apparent from the following description and claims and are illustrated in the accompanying drawings, which by way of illustration, show preferred embodiments of the present invention and the principles thereof and what are now considered to be the best modes contemplated for applying these principles. Other embodiments of the present invention embodying the same or equivalent principles may be used and structural changes may be made as desired by those skilled in the art without departing from the present invention and the purview of the appended claims.

BRIEF DESCRIPTION OF DRAWINGS

FIG. 3A is a plan view of gas flow adjusting means incorporated in a semiconductor processing system according to the present invention, and FIG. 3B is a cross sectional side view of the gas flow adjusting means.

DETAILED DESCRIPTION OF THE INVENTION

Figure 1:
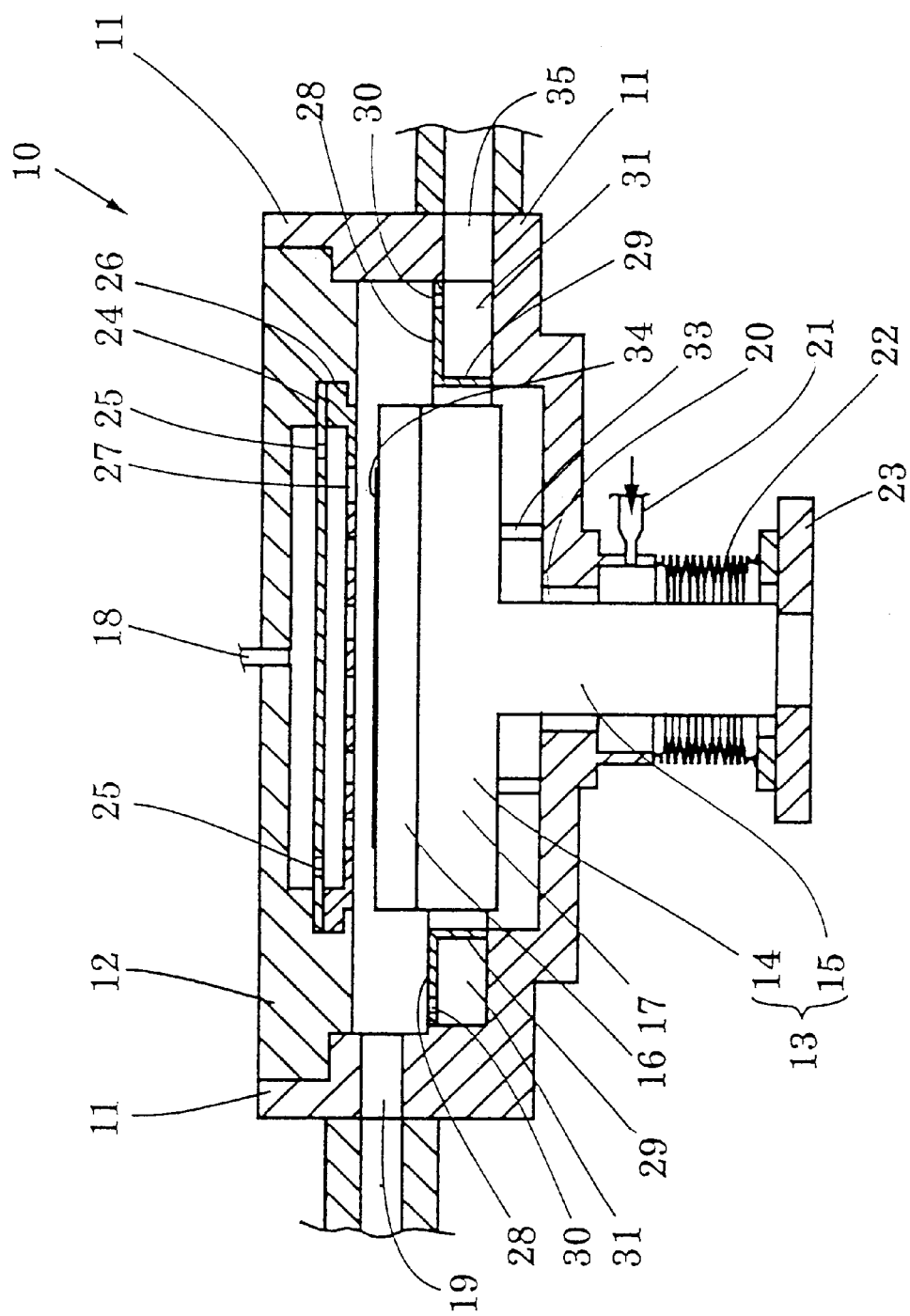
FIG. 1 is a cross sectional side view of a single wafer processing type of a semiconductor processing system according to the present invention.

FIG. 1 is across sectional view of a single wafer processing type of a semiconductor processing system according to the present invention, and as shown in FIG. 1, the system comprises a reactor 10 which has a side wall 11 and a top wall 12 and is hermetically sealed. A wafer 34 is loaded into and unloaded from the reactor 10 by means for loading a wafer such as an articulated robot through an opening 19 provided in the side wall 11.

The wafer 34 is mounted on a susceptor 16 provided at a top part of a movable member 13 which can be moved upward and downward by elevator means (not shown) provided outside the reactor 10.

The movable member 13 is formed of a disk 14 and a shaft 15 extended downward from a back side of the disk 14. The susceptor 16 is mounted on the disk 14, and a heater 17 is incorporated in one with the disk 14 below the susceptor 16.

The shaft 15 of the movable member 13 is extended through an opening 20 provided in a bottom part of the reactor 10 and is fixed on a table 23 connected to the elevator means provided outside the reactor 10 so as to move the susceptor 16 upward and downward in the reactor 10.

The opening 20 provided in the bottom of the reactor 10 and the shaft 15 of the movable member 13 are hermetically sealed by a vertically expandable bellows 22, and in order not to flow an active gas into an inner space defined by the bellows 22, a gas inlet 21 is provided for introducing an inert gas such as argon, helium and the like into the inner space of the bellows 22.

Three vertical through holes 32 (see FIG. 2) are provided in the disk 14 of the movable member 13. Also, three vertical rods 33 are provided on the bottom wall of the reactor 10 so as to pass through those through holes 32. When the movable member 13 is at the lowermost position (that is, when the wafer 34 is loaded into and unloaded from the reactor 10), each tip portion of each rod 33 is vertically projected slightly from the susceptor 16. When the movable member 13 is moved upward, the wafer 34 which has supported as a three-point supporting on the tip portions of the rods 33 is mounted on the susceptor 16.

A process gas to be contributed to a reaction is injected into the reactor 10 through a gas inlet 18 provided in the top wall 12. The process gas is flowed onto a shower plate 26 through openings 25 provided about a circumference of a gas flow adjusting plate 24 and is then supplied onto the wafer 34 through many holes 27 provided in the shower plate 26.

The shower plate 26 and the susceptor 16 are also served as an upper electrode and a lower electrode, respectively, and when an output from a RF power source (not shown) is applied to the shower plate 26, a plasma region can be formed between those electrodes. An anodic oxidation treatment has been made to the lower electrode.

Figure 2:
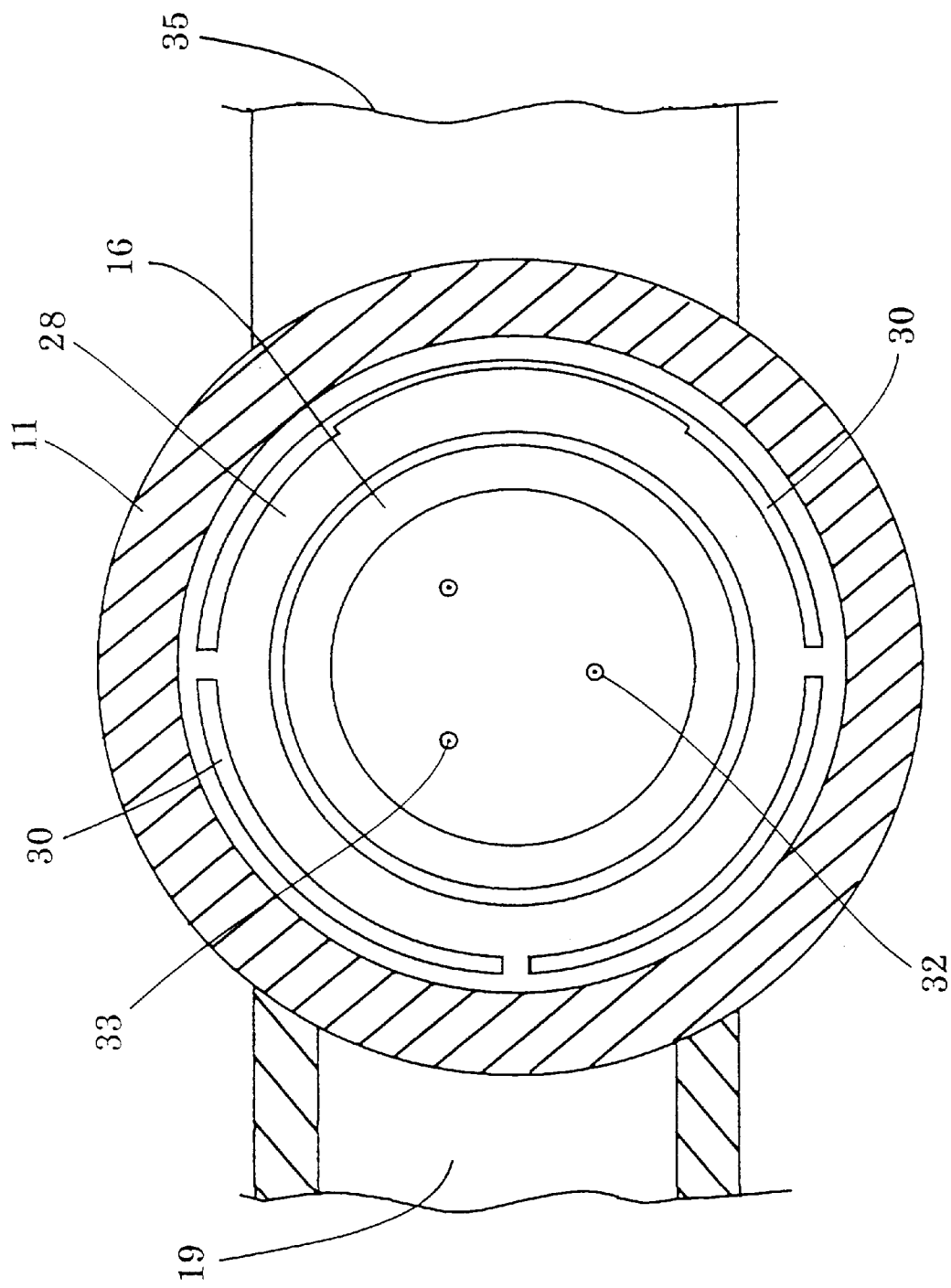
FIG. 2 is across sectional plan view of the system of FIG. 1.

As shown in FIGS. 1 and 2, gas flow adjusting means (28, 29, 30) for uniformly flowing and directing the gas injected onto the wafer 34 in the reactor 10 radially from a central part of the wafer 34 to a circumferential part thereof are provided in a lower part of a circumference of the side wall 11 of the reactor 10.

As shown in FIG. 3, the gas flow adjusting means have an inner circular opening and the susceptor 16 can pass through this inner circular opening. The gas flow adjusting means comprise an annular top plate 28 having a circumference corresponding to a wall surface of the side wall 11 and a cylindrical side plate 29 extended downward from a circumference of the inner circular opening provided in a central part of the annular top plate 28. The gas flow adjusting means are positioned below the wafer 34 and are kept a vertical distance from the wafer 34 at more than about one and half of a distance between the plasma electrodes (i.e. between the shower plate 26 and the susceptor 16), so as to form a difference in level between a surface of the top plate 28 and the wafer 34.

A plurality of arced slits 30 are provided adjacent to the side wall 11 in the top plate 28 of the gas flow adjusting means. It is desirable that a space between those slits is small. In FIG. 2, a semi-circular slit and two quarter-circular slits are provided, and in alternative, two semi-circular slits may be provided.

The slits 30 are communicated with an exhaust port 35 connected to a vacuum source (not shown), and the gas injected into the reactor 10 is flowed and directed into an annular channel 31 through those slits 30 and is then pumped out from the reactor 10.

Each slit 30 has slightly the same width. However, because the gas is strongly pumped about the exhaust port 35, a width of the slit 30 about the exhaust port 35 is less than about half of a width of another part thereof, so that the gas to be pumped is not biased about the exhaust port.

While a width of each slit 30 depends on a nature of the gas and a process, the width is determined so that the gas can be passed through the slits at 0.5 to 10 m/sec.

Figure 4:
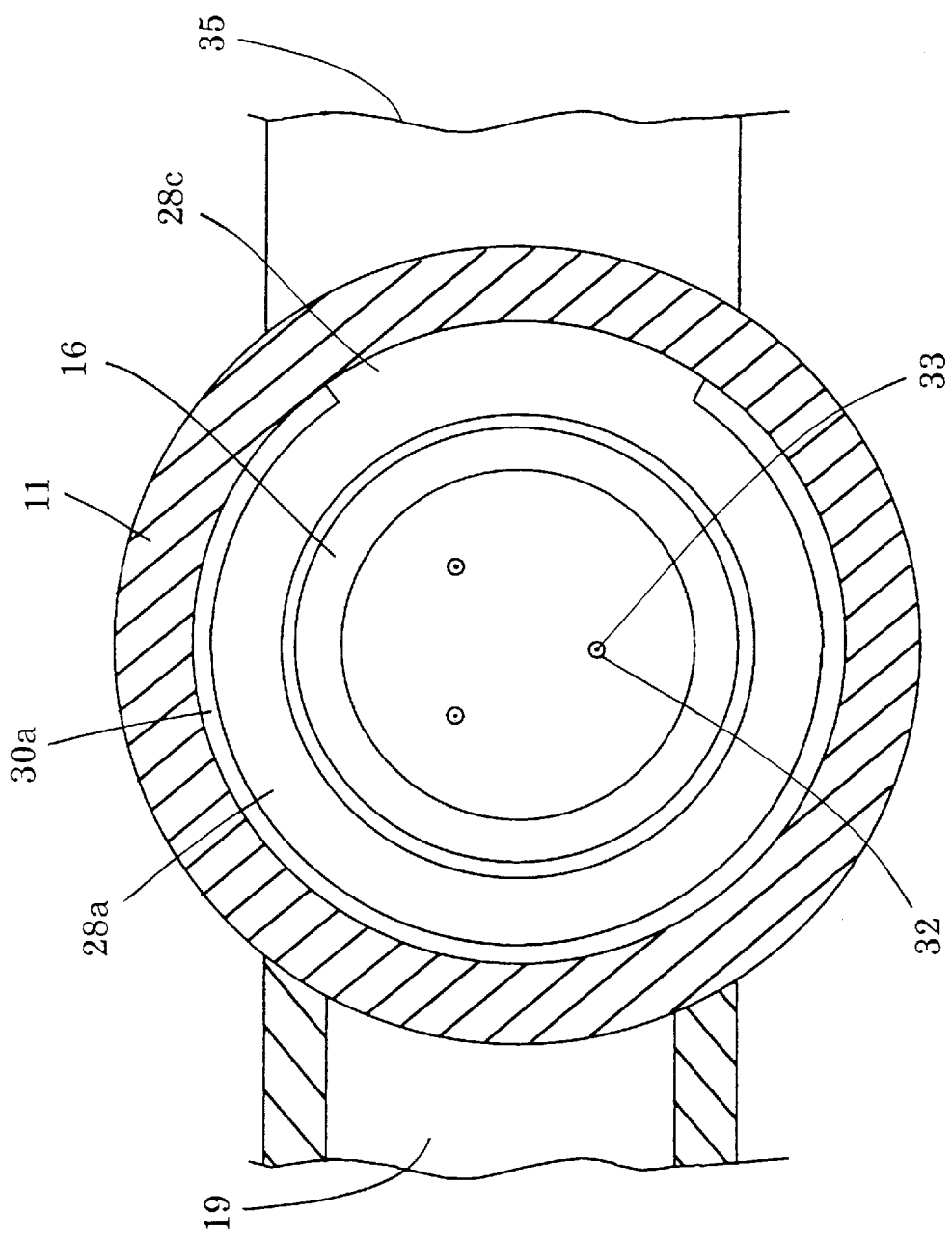
FIG. 4 is a cross sectional plan view of a single wafer processing type of a semiconductor processing system according to the present invention in which the other gas flow adjusting means are incorporated.

FIG. 4 is a cross sectional view of a semiconductor processing system using another gas flow adjusting means. The gas flow adjusting means of FIG. 4 comprise an annular top plate 28a and a side plate 29a in similar to the gas flow adjusting means of FIG. 3 but it is different from that of FIG. 3 that a circumference of the top plate 28a is not touched on the side wall 11 and a slit 30a is formed between the circumference of the top plate 28a and the side wall 11. It should be noted that an extended part 28c is partially formed at a part of the circumference of the top plate 28a positioned above the exhaust port 35. This extended part is aimed not to bias a pumped gas about the exhaust port, and a circumference of the extended part may be touched on the side wall 11 (as shown in FIG. 4) and, as an alternative way, may not be touched thereon if this aim can be achieved.

Figure 5:
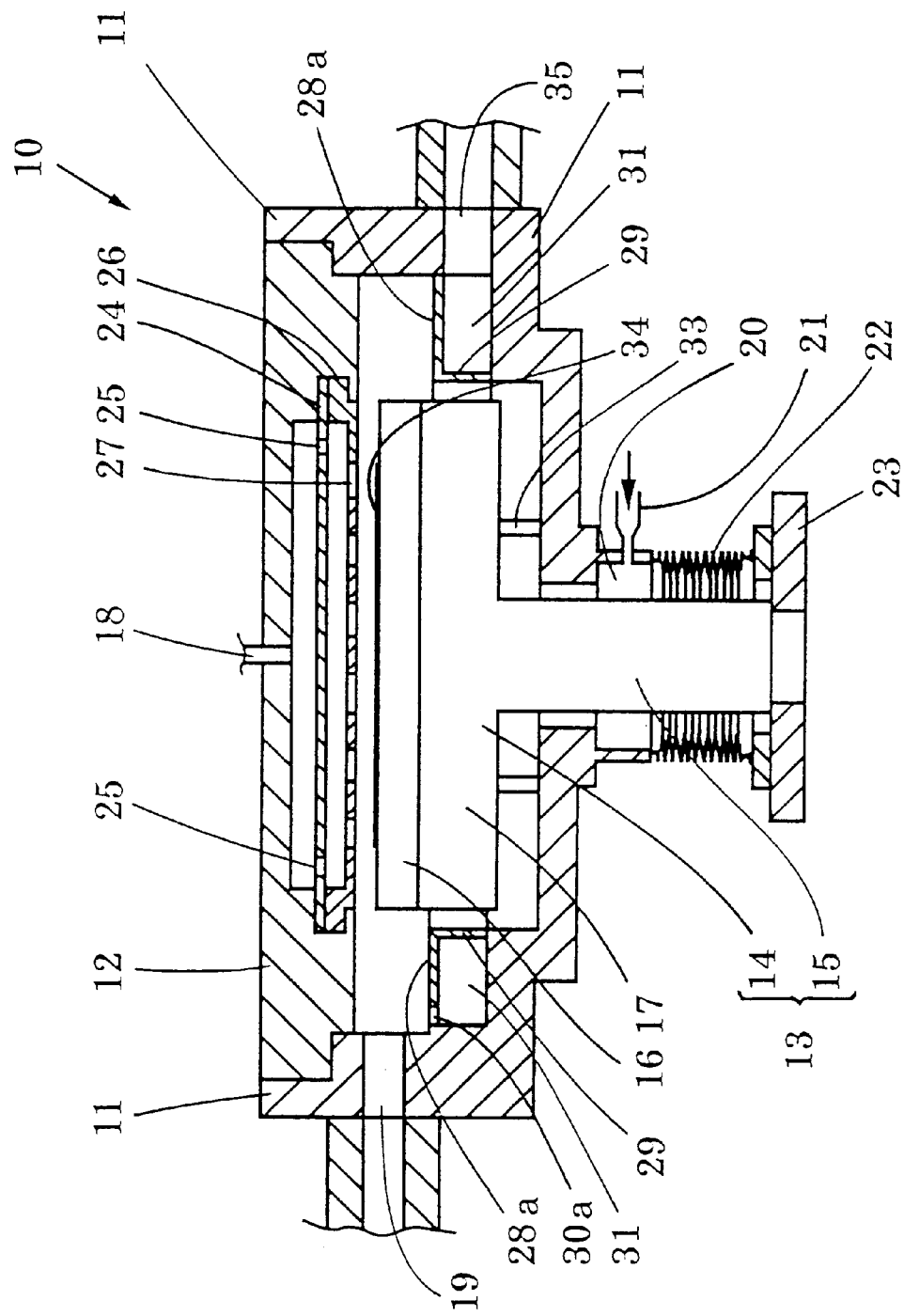
FIG. 5 is a cross sectional side view of a single wafer processing type of a semiconductor processing system according to the present invention in which the gas flow adjusting means shown in FIG. 4 is incorporated.

FIG. 5 is a cross sectional view of a semiconductor processing system in which the gas flow adjusting means of FIG. 4 is incorporated.

Figure 6:
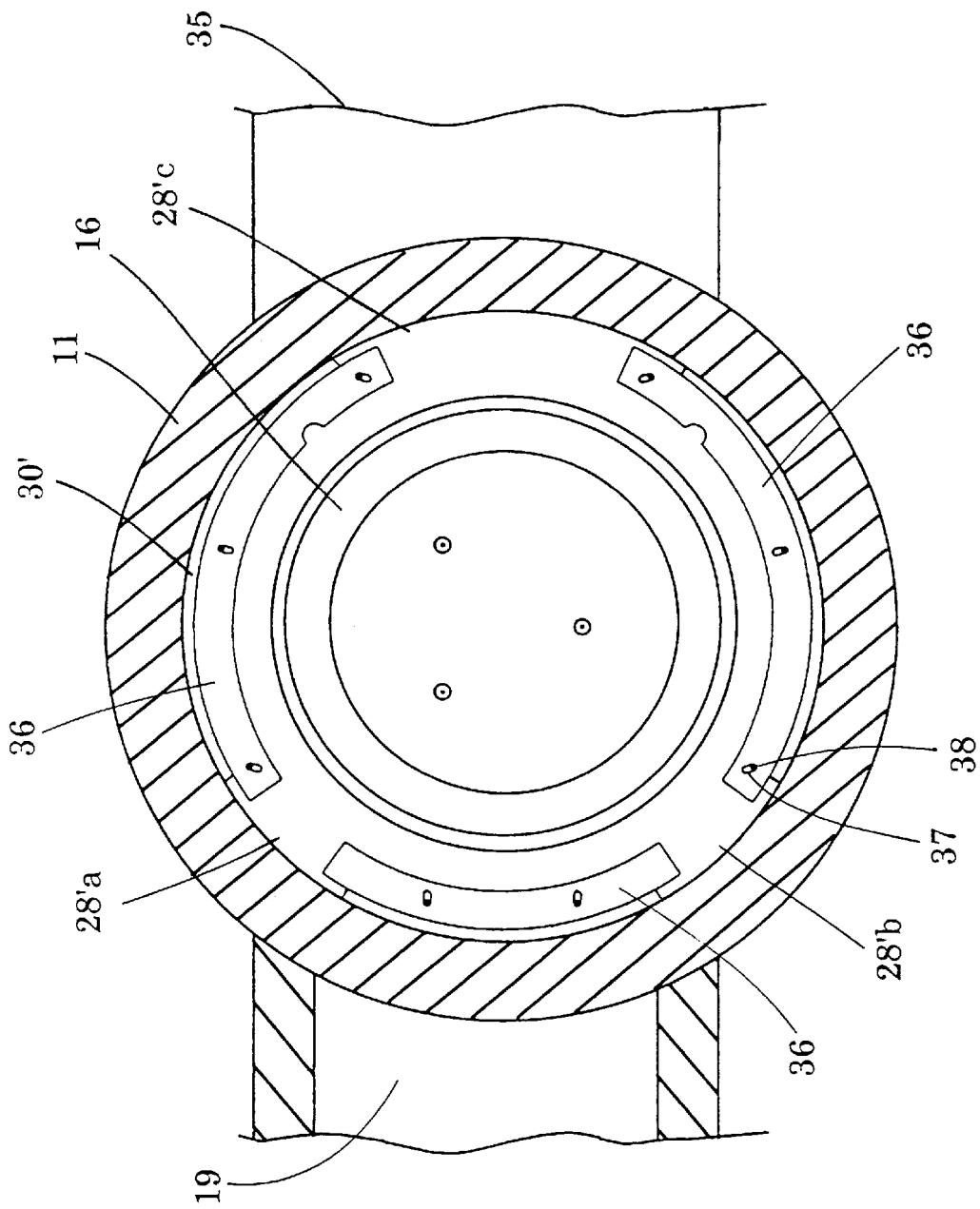
FIG. 6 is a cross sectional plan view of a single wafer processing type of a semiconductor processing system according to the present invention in which the other gas flow adjusting means are incorporated.

FIG. 6 is a cross sectional view of a semiconductor processing system in which the other gas flow adjusting means is incorporated. This gas flow adjusting means of FIG. 6 comprise a top plate 28' and a side plate (as referred to the side plate 29 of FIG. 3B) in similar to the gas flow adjusting means of FIG. 4 but it is different from those of FIG. 4 that a plurality of extended parts (preferably, three extended parts 28'a, 28'b and 28'c ) are partially formed at a plurality of parts of a circumference of the top plate 28'. The extended part 28'c is positioned above the exhaust port 35. This extended part may be or may not be touched on the side wall 11 in similar to the gas flow adjusting means of FIG. 4. Slits 30' are formed between the side wall 11 and parts along the circumference of the top plate 28' other than the extended parts 28'a, 28'b, 28'c.

Slidable plates 36 are provided on the annular top plate 28', and each slit 30' can be partially covered with each slidable plate 36 so as to adjust a width of each slit 30'. At least more than two, preferably, three parallel guide slots 37 are provided in each slidable plate 36. Each slidable plate 36 can be fixed on the top plate 28' by thrusting screws 38 into the top plate 28' through those guide slots 37. Also, the slidable plate 36 can be slide along the guide slots 37 by loosening those screws 38 so as to adjust the width of each slit 30' (see FIG. 7).

Figures 7A, 7B:
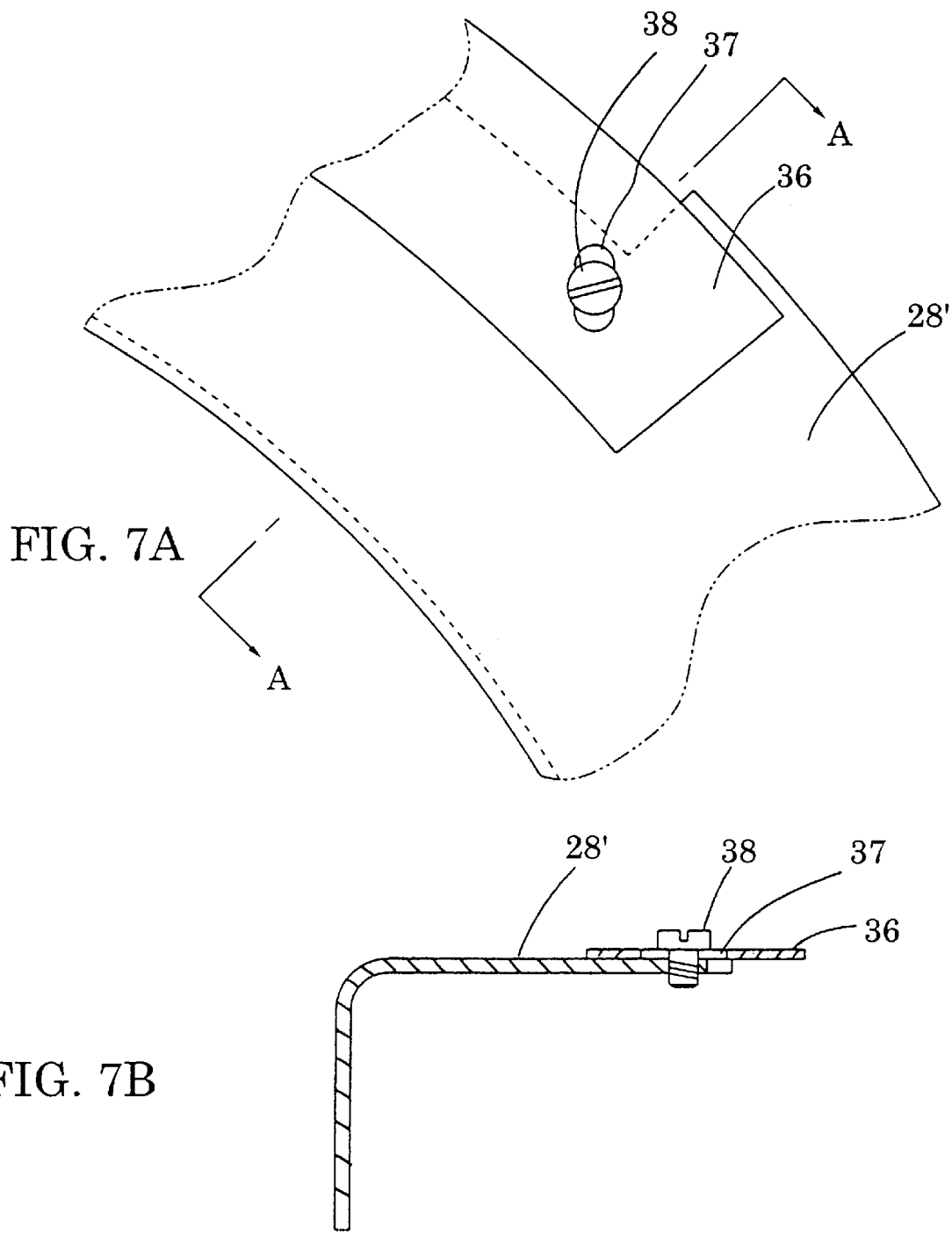
FIG. 7A is a partial enlarged view of a top plate of the gas flow adjusting means shown in FIG. 6 to show that a slidable plate is attached in the gas flow adjusting means.
FIG. 7B is a cross sectional view of the gas flow adjusting means cut along A—A line of FIG. 7A.

By use of the gas flow adjusting means having the slidable plates as shown in FIGS. 6 and 7, the gas flow rate passing through each slit can be adjusted by sliding the slidable plate without replacing the gas flow adjusting means in dependent on a nature of the gas and a process.

The slidable plates described above can be applied not only for the gas flow adjusting means of FIG. 6 but also for the gas flow adjusting means of FIG. 3 or 4.

In the semiconductor processing system described above, the gas injected downward into the reactor 10 is supplied onto the wafer 34 through the holes 27 of the shower plate 26 and is then radially flowed and directed to the annular slits 30 30a, 30') provided below the wafer 34 through the wafer 34. Then, the gas is flowed into the annular channel 31 through the annular slits 30 (30a, 30') and is pumped out from the reactor 10 through the exhaust port 35.

Meanwhile, the inert gas introduced in the inner space of the bellows 22 is flowed into the reactor 10 through the opening provided in the bottom of the reactor 10 and is then passed between the side plate 29 of the gas flow adjusting means and the movable member 13. Then, the inert gas is flowed into the annular channel 31 through the slits 30 (30a, 30') and is pumped out from the reactor 10 through the exhaust port 35.

As described above, the semiconductor processing system according to the present invention has a plasma self cleaning mechanism. The top plate and the side plate of the gas flow adjusting means should be proof against oxygenic or fluoric plasma and are made of a metal or, preferably, an aluminum alloy to diffuse an activated fluoric gas for cleaning in the reactor. In contrast, in a chemical cleaning type of a semiconductor processing system in which a chemically reactive gas is introduced into a reactor to change a deposit into a gas condition in order to perform a cleaning inside the reactor, it is unnecessary to consider a plasma charging region, and thus, the gas flow adjusting means used in such a semiconductor processing system can be made of a material, which is proof against a process gas, such as ceramics of quartz, alumina, aluminum nitride, aluminum oxide and the like.

Figure 8:
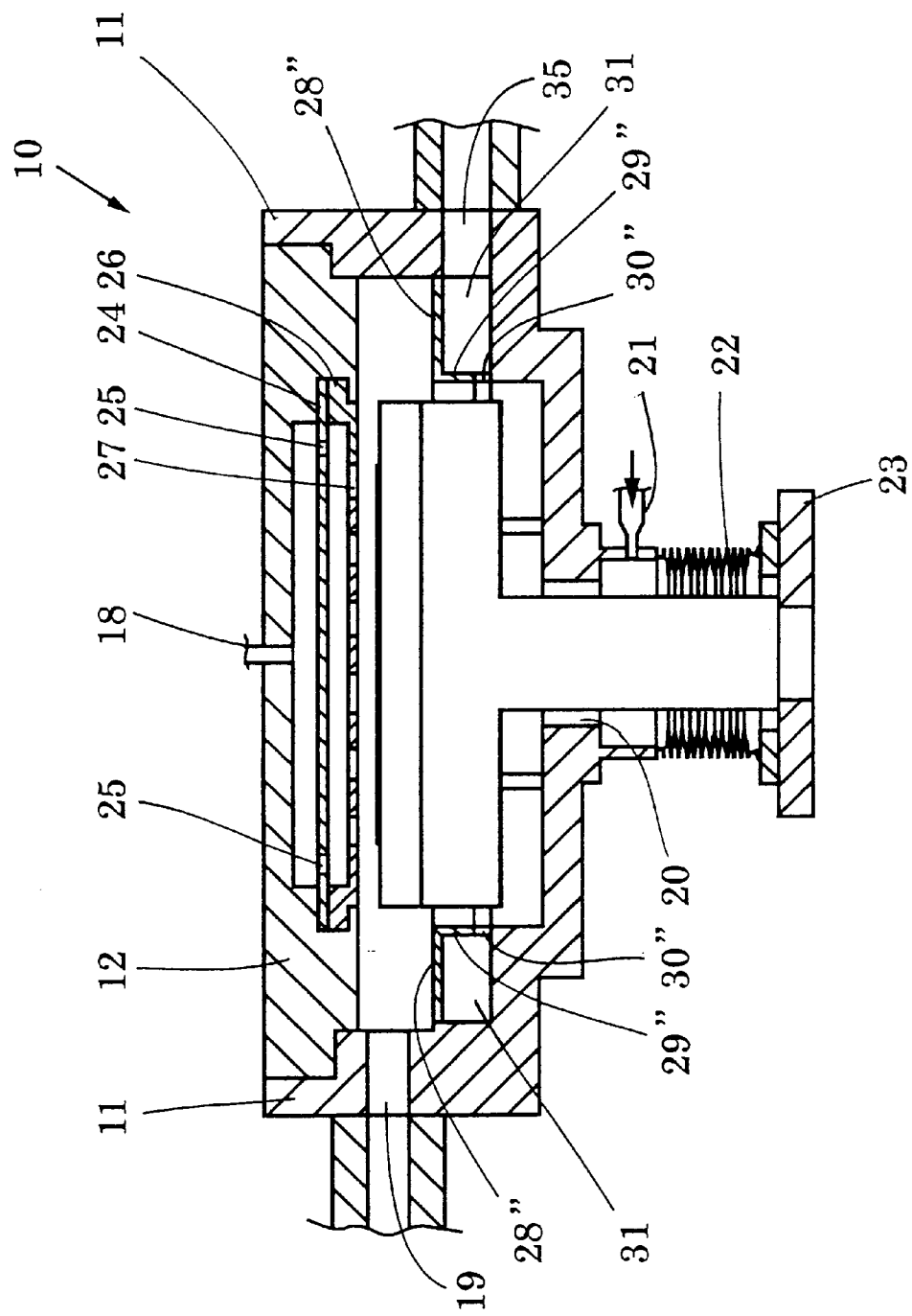
FIG. 8 is a cross sectional plan view of a single wafer processing type of a semiconductor processing system according to the present invention in which the other gas flow adjusting means are incorporated.

The gas flow adjusting means of the semiconductor processing system shown in FIG. 8 comprise an annular top plate 28" which is similar to that of the gas flow adjusting means of FIG. 1 (but slits similar to the slits 30 are not formed therein) and a side plate 29", and an annular channel 31 communicated with the exhaust port 35 is formed by the top plate 28" and the side plate 29". A slit 30" is formed between a lower end of the side plate 29" and a bottom of the reactor 10. In this embodiment, it is desirable that a width of the slit about the exhaust port 35 is narrowed. A gas injected into the reactor 10 is flowed into the annular channel 31 through the slit 30" and is then pumped out from the reactor 10.

In alternative, a slit can be formed in the side plate itself. Moreover, slidable plates (note that the slidable plates should be curved in corresponding to a shape of the side plate) similar to the slidable plates described with referring to FIGS. 6 and 7 can be incorporated to adjust the width of the slit.

EXAMPLE

Silicon oxide film is deposited on a silicon wafer (200 mm) by use of a single wafer processing type of a semiconductor processing system of the present invention shown in FIG. 1.

The number of holes provided in the shower plate for supplying a process gas onto the wafer is 5000 holes and each hole has 0.5 mm in diameter.

Tetraethoxysilane ($Si(OC_2H_5)_4$) (TEOS) and oxygen are injected into the reactor as the process gas. The flow rate of TEOS is 80 sccm, and that of oxygen is 800 sccm.

Pressure in the reactor is set at 3 Torr, and the wafer temperature is set at 360° C. 13.56 MHz, 285 W and 430 KHz, 315 W of RF output are applied to the shower plate.

A distance between the susceptor (as a ground electrode for supporting the wafer and the shower plate (as a RF electrode) is 10 mm.

The top plate and the side plate of the gas flow adjusting means are made of aluminum alloy (A 5052). Three slits are provided in the top plate positioned at about 182 mm from thr center of the wafer, along the side wall of the reactor and below the wafer position, and the width of each quarter circular slit is 3.5 mm and the width of the semi-circular slit positioned about the exhaust port is 1.0 mm (the total area of those slits is about 40 $cm^2$). The total flow rate 880 sccm of the process gas (80 sccm (TEOS) and 800 sccm (oxygen)) is passed through the slits at 0.55 m/sec.

As a result, the deposition rate of the silicon oxide film is 660 nm/min., and measured data of the film thickness is as follows.

| Wafer No. | Average thickness | Uniformity of thickness |
| --- | --- | --- |
| 1 | 608.7 nm | ±0.94% |
| 2 | 607.6 nm | ±1.07% |
| 3 | 607.9 nm | ±0.87% |
| 4 | 610.1 nm | ±0.95% |
| 5 | 608.2 nm | ±0.89% |
| 6 | 606.6 nm | ±0.95% |

It is difficult in the art to achieve the uniformity of thickness within ±3%. In contrast, as seen, it is achieved by according to the present invention that the uniformity of thickness is within about ±1%.

After the film deposition is completed, the wafer is unloaded from the reactor to perform a plasma cleaning of the reactor. A gas mixture of $C_2F_6$(1000 sccm, 1.0l/ min.) and $O_2$ (1200 sccm, 1.2l/ min.) is injected into the reactor through the shower plate. RF output (13.56 MHz, 700 W) is applied to the shower plate to create a plasma charging condition between the electrodes. Fluoric active species is generated, and the reactor is cleaned thereby.

As a result, a reaction product is not observed in the gas flow adjusting means of the inner and bottom wall of the reactor, and the cleaned wall surface thereof is achieved.

What is claimed is:

1. A semiconductor processing system comprising:
   a reactor for processing a single wafer, said reactor having an inner wall and a bottom wall;
   a susceptor for supporting a wafer to be processed inside said reactor;
   a gas injector for injecting a processing gas downward onto said wafer supported by said susceptor;
   an exhaust port provided with said reactor, for a gas being pumped from said reactor; and
   a gas flow adjuster arranged around said susceptor and having at least one slit through which said injected gas is discharged to said exhaust port, said slit having an opening area smaller adjacent to said exhaust port than away from said exhaust port to cause said injected gas to uniformly flow over said wafer in a radial direction, wherein said gas flow adjuster includes an annular top plate, and said slit is defined by a circumference of said plate and said reactor inner wall, said gas flow adjuster further including an adjuster cover for covering said slit to adjust the opening area of said slit, said adjuster cover being movable in a radial direction.

2. The system of claim 1 wherein said gas flow adjuster further includes a cylindrical side wall extending downward from an inner end of said plate to said reactor bottom wall.

3. A semiconductor processing system comprising:
   a reactor for processing a single wafer, said reactor having an inner wall and a bottom wall;
   a susceptor for supporting a wafer to be processed inside said reactor;
   a gas injector for infecting a processing gas downward onto said wafer supported by said susceptor;
   an exhaust port provided with said reactor, for a gas being pumped from said reactor; and
   a gas flow adjuster arranged around said susceptor and having at least one slit through which said injected gas is discharged to said exhaust port, said slit having an opening area smaller adjacent to said exhaust port than away from said exhaust port to cause said injected gas to uniformly flow over said wafer in a radial direction, wherein said gas flow adjuster includes an annular top plate and a cylindrical side wall extending downward from an inner end of said plate, and said slit is defined by a lower part of said side wall and said bottom wall of said reactor.

4. The system of claim 1 or 3 wherein said semiconductor processing system is a chemical vapor deposition system.

5. The system of claim 4 further including a plasma self cleaning mechanism, wherein said chemical vapor deposition system is a plasma excitation chemical vapor deposition system and said gas flow adjuster is made of a metallic material.

6. The system of claim 5 wherein said gas flow adjuster is made of a material selected from the group consisting of aluminum and aluminum alloy.

7. The system of claim 1 or 3 wherein said at least one slit has a width which is narrower at a position adjacent to said exhaust port than at a position away from said exhaust.

8. The system of claim 7 wherein said at least one slit is located away from said exhaust port but is not located adjacent to said exhaust port.

* * * * *